(12) United States Patent
Breen et al.

(10) Patent No.: US 6,664,576 B1
(45) Date of Patent: Dec. 16, 2003

(54) POLYMER THIN-FILM TRANSISTOR WITH CONTACT ETCH STOPS

(75) Inventors: Tricia L. Breen, Hopewell Junction, NY (US); Lawrence A. Clevenger, LaGrangeville, NY (US); Louis L. Hsu, Fishkill, NY (US); Li-Kong Wang, Montvale, NJ (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/254,739

(22) Filed: Sep. 25, 2002

(51) Int. Cl.$^7$ .............................................. H01L 27/148
(52) U.S. Cl. ...................................................... 257/220
(58) Field of Search ................................ 257/220, 328

(56) References Cited

U.S. PATENT DOCUMENTS 6,544,824 B1 * 4/2003 Pradeep et al. ............. 438/156

* cited by examiner

*Primary Examiner*—David Nelms
*Assistant Examiner*—Quoc Hoang
(74) *Attorney, Agent, or Firm*—McGinn & Gibb, PLLC; Robert M. Trepp, Esq.

(57) ABSTRACT

A method and structure of forming a vertical polymer transistor structure is disclosed having a first conductive layer, filler structures co-planar with the first conductive layer, a semiconductor body layer above the first conductive layer, a second conductive layer above the semiconductor body layer, and an etch stop strip positioned between a portion of the first conductive layer and the semiconductor body layer.

18 Claims, 6 Drawing Sheets

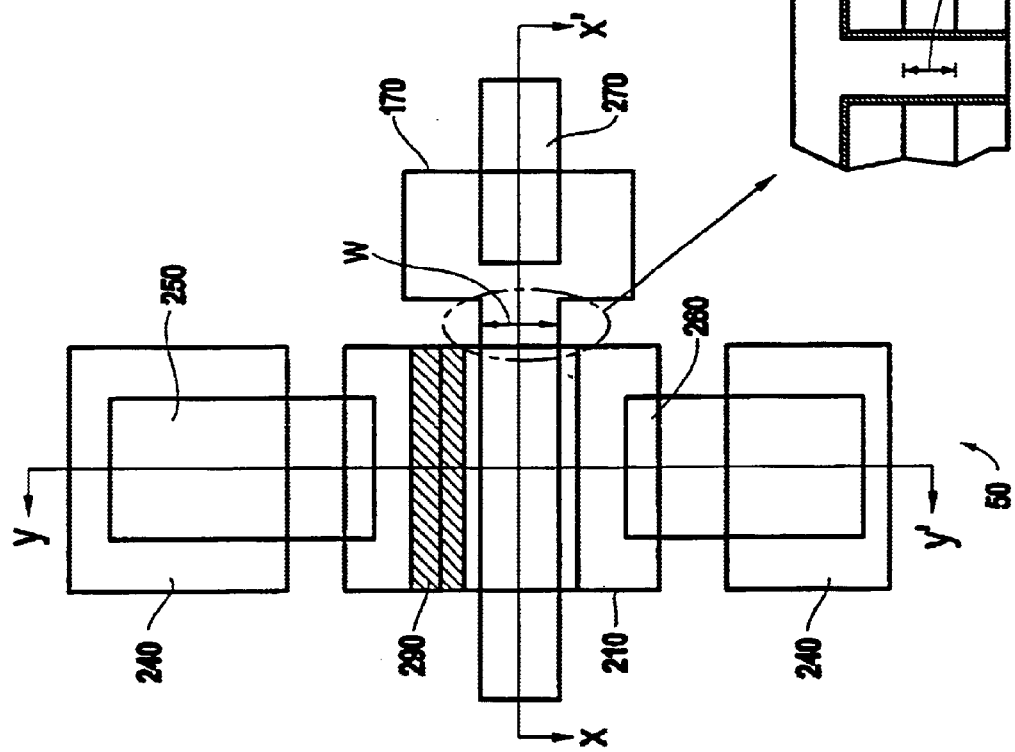
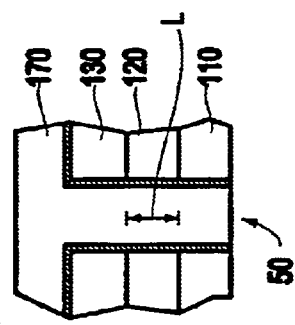
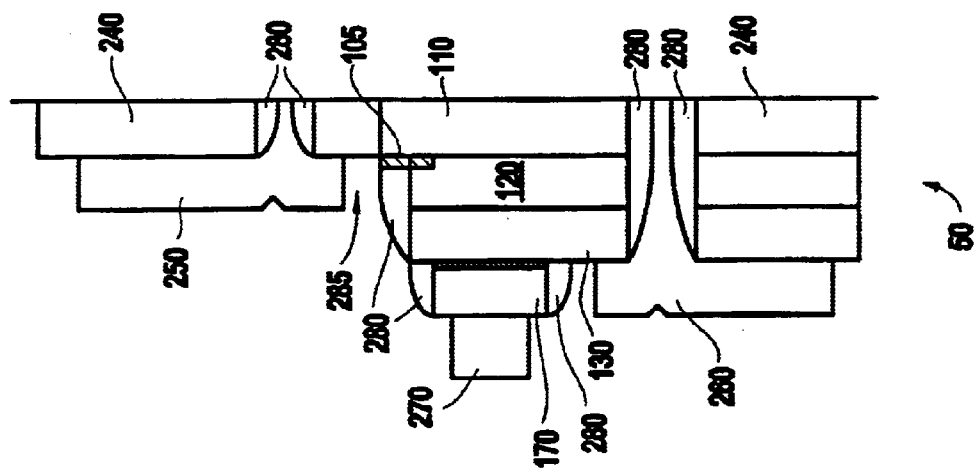

POLYMER THIN-FILM TRANSISTOR WITH CONTACT ETCH STOPS

BACKGROUND OF THE INVENTION

1. Field of the Invention

The present invention generally relates to semiconductor technology and device designs, and more particularly to an organic-based thin film transistor device and a method for producing the same.

2. Description of the Related Art

Thin film transistors (TFTS) with active organic layers and polymer-based electronic components are emerging as an inexpensive alternative to silicon-based TFTs for some applications. The use of organic and polymeric materials provides two main advantages. First, organic-based devices can be produced using a simpler and cheaper fabrication process, in contrast to the expensive equipment and processing associated with silicon processing. Second, it is possible to fabricate the devices on flexible plastic substrates, due to the ability to process organic materials at lower temperatures, and to the greater mechanical flexibility of organic-based components relative to inorganic materials such as silicon and conductive metals. However, despite considerable research and development effort, organic-based TFTs have not yet reached commercialization, at least in part due to relatively poor device characteristics of prior art organic TFTs.

Fabrication of an all-organic TFT requires various organic or organic/inorganic hybrid materials: semiconductors, insulators, and conductors. The conductor may be selected from conducting polymers such as polyaniline and poly (ethylene dioxide thiophene), and metal or graphite colloid particle-based inks. There are a variety of polymeric organic insulators that may be used, such as polyamide or PMMA for the semiconductor. Organic p-type (hole transporting) and n-type (electron transporting) materials are both known in the art and have been tested as the semiconductive channel in TFTs.

In general, circuitry using organic transistors have the potential of reduced power consumption and simplicity in the design. However, complementary circuitry using both organic N and P channels transistors are not common, for example, U.S. Pat. No. 5,625,199, the complete disclosure of which is herein incorporated by reference, teaches a technique to fabricate complementary circuits with inorganic n-channel and organic p-channel thin film transistors. Additionally, U.S. Pat. No. 5,936,259, the complete disclosure of which is herein incorporated by reference, describes a switch based on a thin film transistor design (TFT) using a fused ring organic compound as semiconductor. Furthermore, U.S. Pat. No. 5,804,836, the complete disclosure of which is herein incorporated by reference, describes an image processor design which operates on an array of polymer grid triodes. Similarly, prior art disclosures also teach a 5-stage ring oscillator using copper hexadecafluorophthalocyanide as the n-channel material and oligothiophenel oligothiophene derivative as the p-channel material.

Two popular structures of an existing polymer thin-film transistor are shown in FIGS. 9(a) and 9(b). These structures have two major disadvantages. First, there is a corner thinning problem due to topography, and second, the most sensitive portion of the body element is exposed to process induced contamination. The resulting devices have poor performance and inconsistent properties. Shown in FIG. 9(a) is the first typical structure of the polymer transistor. The source 11 and drain 12 are first patterned. Then the body material 13 is deposited and patterned. The body 13 is a semiconductive polymer or oligomer, and it is applied to the surface of the source 11 and drain 12 islands by evaporation, spin-coating, dip-coating or printing, depending on the organic semiconductor used.

The body material 13 is patterned in one of three ways. The most common method is by evaporation of the semiconductive material through a shadow mask. The other two methods are printing (i.e., screen printing or inkjet printing) and using conventional lithography by first applying a protective coating over the semiconductor, then applying the photoresist, patterning, and etching. A brief thermal anneal may be needed, depending on which type of organic semiconductor material is used. The last step is applying a protective coating to the semiconductor to passivate the devices from contamination.

After patterning the body portion 13, the substrate is wet cleaned. The body surface, especially in the channel region, deteriorates due to the unwanted chemical reaction. After a thermal treatment, the body element 13 becomes thin around the corners 16, 17 of the source 11 and drain 12 due to reflow. Typically, semiconductors decompose before melting. The source/drain 11, 12 to body contact area are significantly reduced as the result of the corner thinning 16, 17 of the body element 13. Then, the gate material 14 is deposited after a thin insulating polymer 15 is coated on top of the body element 13 and the exposed source 11 and drain 12 regions.

Another common structure of the polymer TFT structure is shown in FIG. 9(b). The gate 14 is formed first, then an insulating polymer 15 is coated thereon. Again, the corner thinning problem presented at the corners 16, 17 of the gate 14 causes the possibility of shorting of source 11 and drain 12 to the gate 14. After the source 11 and drain 12 are formed, the body element 13 is formed. In this case, since the body to channel interface is not exposed to any chemical, the resulting transistor yield and performance is better than those of the first transistor.

In both of the bottom-contact devices shown in FIGS. 9(a) and 9(b), there is a well-documented problem with ensuring good contact between the electrodes and the organic semiconductor. One approach used to solve this problem has been to modify the surface properties of gold electrodes using thin self-assembled monolayers, which improves wetting of the electrode by the organic semiconductor and may also decrease the chance of delaminating. However, the topography of the bottom electrodes may still hamper film formation and reduce the contact area. Therefore, there is a need for a new and improved structure and method for forming a polymer thin film transistor, which does not have the problems inherent with the prior art devices.

SUMMARY OF THE INVENTION

In view of the foregoing and other problems, disadvantages, and drawbacks of the conventional thin film transistor devices, the present invention has been devised, and it is an object of the present invention to provide a structure and method for a polymer thin film transistor with contact etch stops.

Another object of the present invention is to provide a thin film p olymer transistor having a vertical channel, or a transistor whose channel is structured in the third dimension (or 3-D). Yet another object of the present invention is to provide a new polymer thin film transistor structure and method which will result in a high-performance device. Still another object of the invention is to provide a polymer transistor structure so that its base layer is always protected from being contaminated during all process steps. It is yet another object of the invention to insure that the material thinning problem, inherent in conventional devices, is completely eliminated.

In order to attain the objects suggested above, there is provided, according to one aspect of the invention a vertical polymer transistor structure having a first conductive layer, filler structures co-planar with the first conductive layer, a semiconductor body layer above the first conductive layer, a second conductive layer above the semiconductor body layer, and an etch stop strip positioned between a portion of the first conductive layer and the semiconductor body layer. The vertical polymer transistor structure has filler structures that are electrically isolated from the first conductive layer. The filler structures are made of the same material as the first conductive layer. The first conductive layer, the semiconductor body layer, and the second conductive layer have laminated stacks of layers. The vertical polymer transistor structure has a source contact electrically connected to the first conductive layer and a drain contact electrically connected to the second conductive layer, the source contact is on an opposite side of the laminated stack from the drain contact. The filler structures support the source contact and the drain contact, and are positioned below the source contact and below the drain contact. The etch stop strip is positioned at an outer edge of the semiconductor body layer. Having an insulating sidewall spacer connected to the side of the second conductive layer and the semiconductor body layer, the etch stop strip is also between the sidewall spacer and the first conductive layer. The vertical polymer transistors structure has sidewall spacers on adjacent sides of the second conductive layer and the semiconductor body layer, the etch stop strip is also between only one sidewall spacer and the first conductive layer and on only one side of the vertical polymer of transistor structure.

A vertical polymer transistor structure is formed by depositing a first conductive layer on a substrate, patterning an etch stop strip over the first conductive layer, depositing a semiconductor body layer over the first conductive layer, and depositing a second conductive layer over the semiconductor body layer. The first conductive layer, the semiconductor body layer, and the second conductive layer have a laminated stack. Patterning the laminated stack creates a first laminated structure and filler structures adjacent the first laminated structure. Patterning the semiconductor body layer and the second conductor layer of the first laminated structure creates a second laminated structure. The etch stop strip protects the first conductive layer during the patterning of the first laminated structure. The invention removes at least a portion of the etch stop strip to expose the first conductive layer and forms contacts to the first conductive layer and the second conductive layer over the filler structures. The filler structures support the source contact and the drain contact. Before removing the etch stop strip, the invention forms sidewall spacers adjacent sides of the laminated structure and the etch stop strip protects the first conductive polymer layer during the forming of the sidewall spacers. The patterning of the etch stop strip positions the etch stop strip at an outer edge of the semiconductor body layer and on only one side of the vertical polymer of transistor structure. The source contact is on the opposite side of the laminated stack from the drain contact.

The features of the inventive vertical polymer thin-film transistor are several. For example, the device uses an etch-stop layer to control contact accuracy. Otherwise, over or under etch will cause a short or poor contact to the device, respectively. Next, the use of a dummy filler structure ensure planarization of the gate and contact material in order to prevent the material thinning problems (inherent in the prior art devices) due to thermal reflow over the sharp corner areas. Also, a high-k dielectric polymer is used to form the gate dielectric to boost the device performance. Another advantage is that the channel length of the device can be much shorter than those of the conventional planar devices. The channel length is defined by the thickness of the semiconductive polymer layer. The channel is limited only by the thinnest film which can tolerate film integrity challenges such as pin holes. Moreover, polymer spacers are used to prevent shorting between conductive polymer layers.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 7(a) is a side view schematic diagram of a completed thin film transistor device according to the present invention shown cut along line Y–Y' of FIG. 7(b);

FIG. 7(b) is a top view schematic diagram of a completed thin film transistor device according to the present invention;

FIG. 7(c) is a cross-sectional view of the completed thin film transistor device of FIG. 7(b);

DETAILED DESCRIPTION OF PREFERRED EMBODIMENTS OF THE INVENTION

As previously mentioned, there is a need for an improved structure and method for a high performance vertical channel polymer thin film transistor device, which does not have the problems inherent with the conventional devices, such as the corner thinning problem due to topography, and avoids having the most sensitive portion of the body element exposed to process induced contamination. According to the present invention, a new and improved structure and method of a polymer thin film transistor is disclosed.

Figure 1:
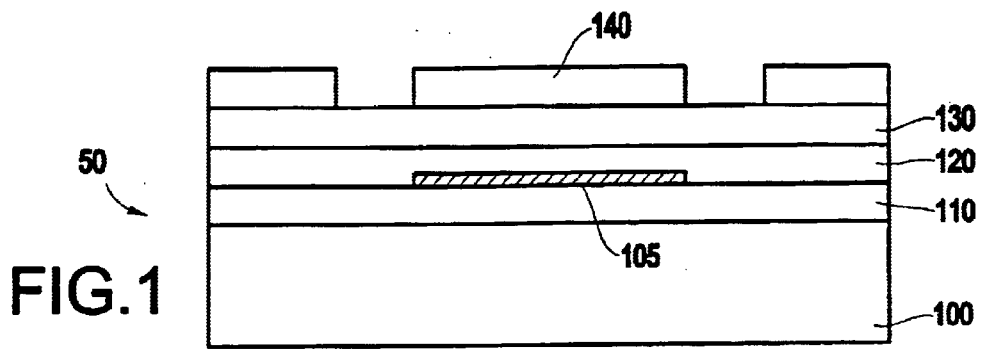
FIG. 1 is a cross-sectional schematic diagram of a partially completed thin film transistor device according to the present invention.

Referring now to the drawings, and more particularly to FIGS. 1 through 8, there are shown preferred embodiments of the method and structures according to the present invention. Specifically, FIG. 1 shows a partially completed thin film transistor device 50 comprising a first conductive polymer layer 110, an etch-stop layer 105, a semiconductive polymer layer 120, and a second conductive polymer layer 130 all deposited consecutively on a substrate 100. The etch-stop layer 105 is a thin non-polymer material, and does not extend through the entire structure in either the lateral or forward directions. The material 105 can be plasma oxide, nitride, $Al_2O_3$, etc. The material 105 can be patterned by a reactive ion etch in $CF_4$ plasma, which has a high etch selectivity to the polymer. Additionally, the etch-stop layer 105 will aid in the later described spacer forming process in order to isolate the source, drain, and gate regions, from the conductive polymer and semiconductive polymer stack. The deposited polymer layers are patterned using a non-polymer (or so-called non-erodible) mask 140 with a good etch rate ratio for patterning the polymer stack 50. The semiconductive layer 120 is sandwiched and protected by the first conductive polymer layer (and etch-stop layer 105) and the second conductive polymer layer 130.

Figure 2:
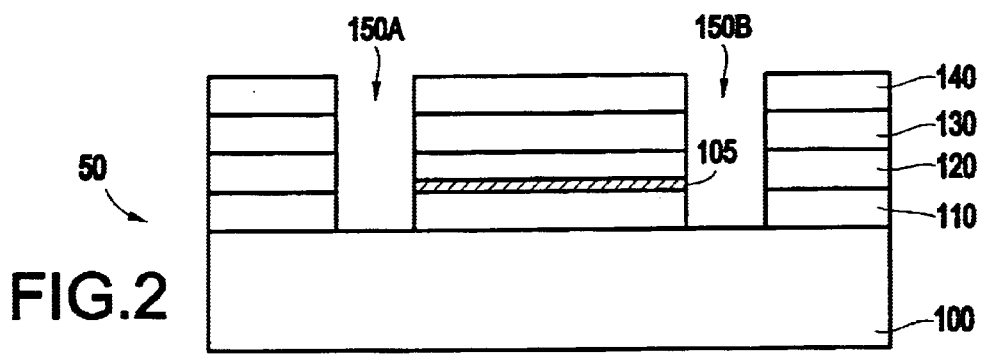
FIG. 2 is a cross-sectional schematic diagram of a partially completed thin film transistor device according to the present invention.

FIG. 2 illustrates the device 50 after the polymer layers have been etched using $O_2$ plasma. The etching process stops at the substrate surface 100 to form spaces 150A and 150B. After etching, the first conductive polymer layer 110 becomes the drain (or source if layer 130 becomes the drain) node of the transistor, the semiconductive layer 120 becomes the body of the transistor, and the second conductive layer 130 becomes the source (or drain if layer 110 becomes the source) node of the transistor 50. The adjacent structure is kept with a proper distance from the device's structure. Additionally, during the polymer stack etching process, the pre-patterned stop layer 105 remains untouched.

Figure 3:
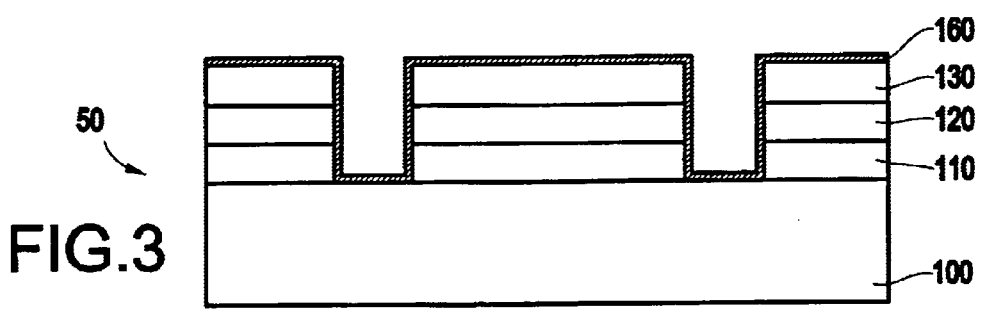
FIG. 3 is a schematic diagram of a partially completed thin film transistor device according to the present invention.

Next, as shown in FIG. 3, a layer of high-dielectric constant polymer material 160 is deposited immediately after the etching and in-situ cleaning processes to form the gate dielectric 160. The semiconductive layer 120 is not exposed to any chemicals during this step. Upon etching, the exposed portion of the semiconductive layer 120 is capped with the high-k film 160. The thinner the material 160 is and the higher the dielectric constant value, the better the transconductance, and thus the better the resulting device performance.

The etch-stop layer 105 is not shown in FIGS. 3, 4, 5(a) and 6(a). As previously mentioned, the etch-stop layer 105 does not extend through the entire device 50, and in FIGS. 3, 4, 5(a) and 6(a) the view is taken from the front of the device 50, whereas FIGS. 1 and 2 show a cross-sectional view of the device 50.

Figure 4:
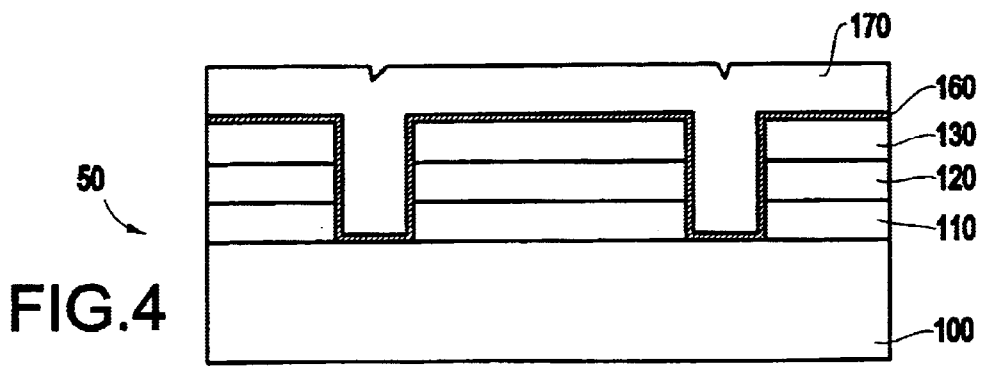
FIG. 4 is a schematic diagram of a partially completed thin film transistor device according to the present invention.

A layer of conductive polymer 170 is then deposited, as illustrated in FIG. 4. The thickness of polymer 170 should be thicker than half of the space width between the adjacent structure (or the dummy fillers) and the device structure. After a thermal reflow process, such as an annealing process, not only is the corner thinning effect avoided, but the surface of the gate is fully planarized as well.

Figure 5A:
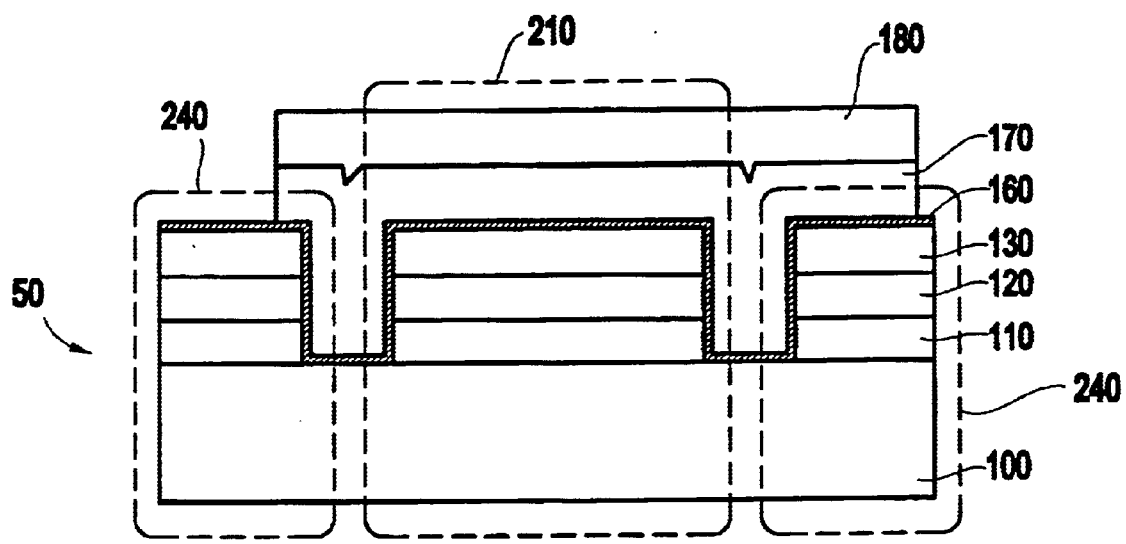
FIG. 5(a) is a schematic diagram of a partially completed thin film transistor device according to the present invention shown cut along line X–X' of FIG. 5(b)
Figure 5B:
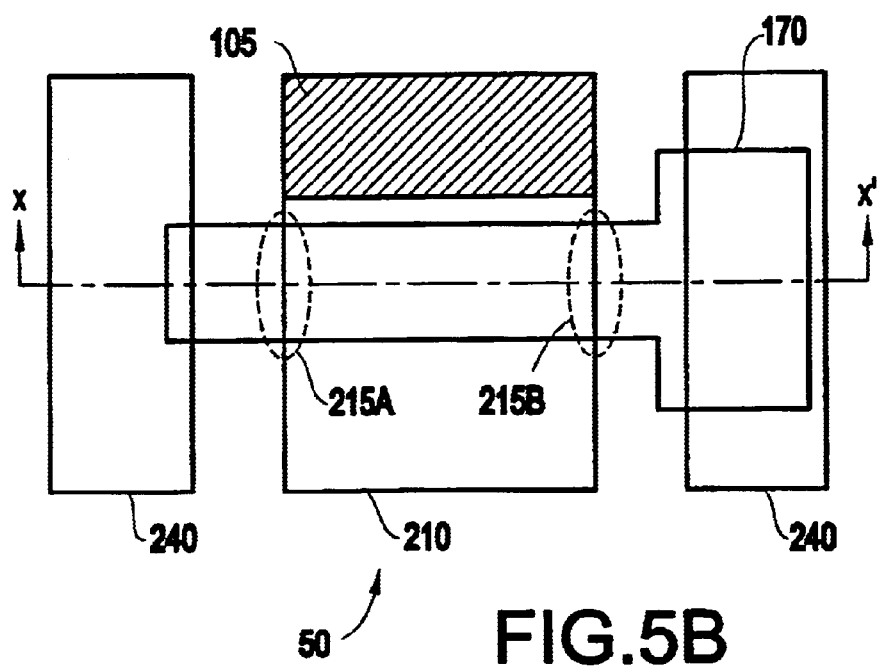
FIG. 5(b) is a top view schematic diagram of the partially completed thin film transistor device of FIG. 5(a)

FIGS. 5(a) and 5(b) show alternate views of the device structure 50 after the gate polymer 170 is patterned via a conventional lithographic process, for example by using a non-erodible mask 180 as depicted in FIG. 5(a). The corresponding top view of the polymer transistor 50 at this stage is shown in FIG. 5(b). Additionally, in FIG. 5(b), the resulting gate polymer structure 170 is illustrated after being patterned. The vertical transistor is formed on the sidewalls indicated by circles 215A and 215B.

The location of the etch-stop layer 105 underlying the semiconductive layer 120 is also shown. Moreover, the stack region 210 is shown, which eventually will correspond to the semiconductive polymer stack isolating the source and drain regions of the device 50.

Figure 6A:
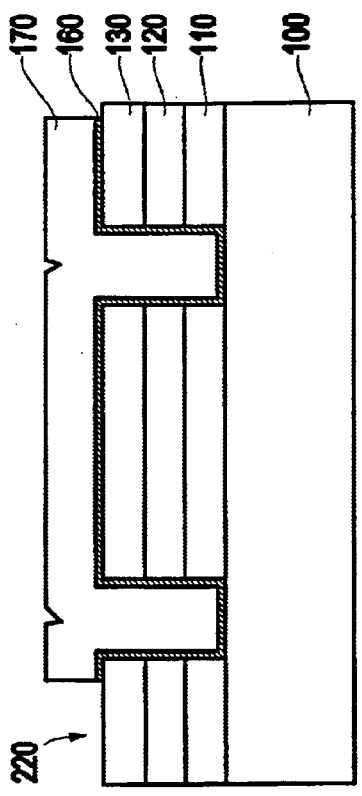
FIG. 6(a) is a schematic diagram of a partially completed thin film transistor device according to the present invention shown cut along line X–X' of FIG. 6(c)
Figure 6C:
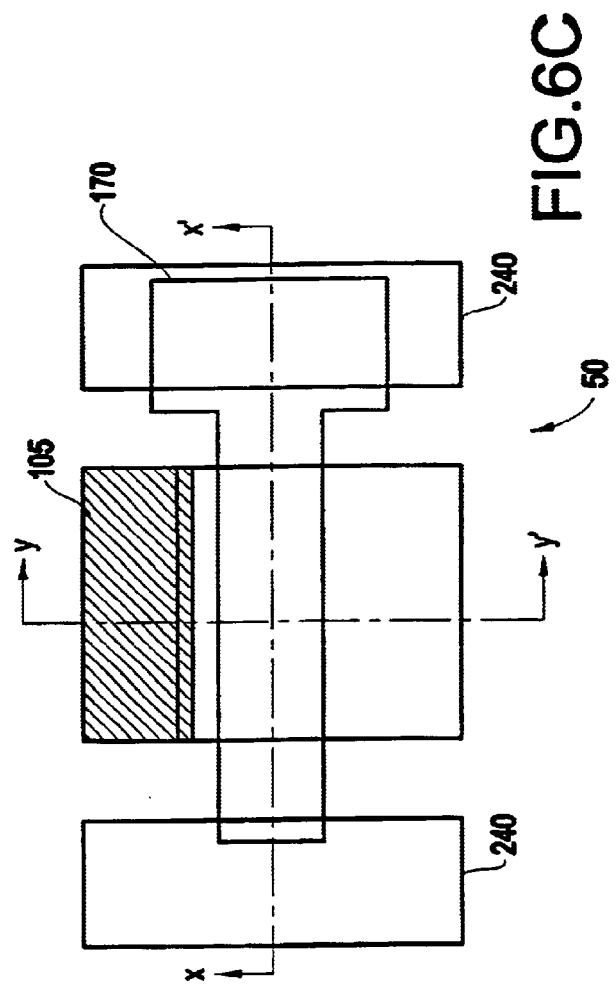
FIG. 6(c) is a top view schematic diagram of the partially completed thin film transistor device of FIG. 6(a)
Figure 6B:
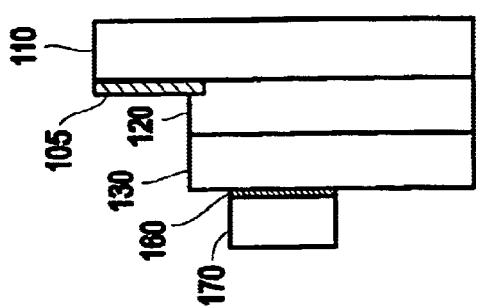
FIG. 6(b) is a side view schematic diagram of a partially completed thin film transistor device according to the present invention shown cut along line Y–Y' of FIG. 6(c)

Next, in FIGS. 6(a), 6(b) and 6(c), the exposed portion of the high-k dielectric material 160 is removed in region 220 of the device 50. Then, another non-erodible mask (not shown) is used to pattern and remove the second conductive polymer 130 and the middle semiconductive polymer 120 in the areas above the etch-stop layer 105. The etch-stop 105 protects the underlying conductive polymer 110 during the etching of the second and third conductive layers 120, 130. This removal of the stack is best seen in FIG. 6(b). After etching, the exposed non-erodible (not shown) mask is selectively removed in order to expose the first conductive polymer layer 110 for the source node contact.

The dummy filler polymer stack 240 are also shown for planarization purposes. The use of a dummy filler structures 240 ensures planarization of the gate 170 and contacts 250, 260 in order to prevent the material thinning problems (inherent in the prior art devices) due to thermal reflow over the sharp corner areas.

FIGS. 7(a), 7(b) and 7(c) show the completed transistor device 50. A polymer sidewall process is carried out to form insulating polymer sidewalls 280 on all the exposed structures. These sidewalls will prevent shorts between any two conductive and semiconductive parts. Here, the etch stop 105 protect the underlying polymer layer 110 during the polymer sidewall 280 formation process. After the polymer sidewalls 280 are formed, the exposed portion of the etch stop 105 (e.g., the portion not protected by the sidewall spacer 280) is removed using a selective removal process. This creates an opening 285 for a contact (not shown) that will be formed directly to the drain 110. Without the etch stop 105, the etching process that forms the sidewall spacers 280 would also remove the conductive polymer 110, thereby resulting in a defective contact to the drain 110. Therefore, as shown above, the invention uses the patterned contact 105 in order to avoid unnecessary thinning or deterioration of the drain region (conductive polymer 110) during the sidewall spacer 280 formation.

A conductive polymer layer 270 is used to form contacts to the gate region 270, source region 250, and drain region 260. The cross-sectional view of the vertical device in the circled region is also illustrated in FIG. 7(c). The conductive polymer material 270 is filled into the gaps in between the device structure 210 and the dummy structures 240.

The gate material 170 is separated from the body 120, drain 130 and source 110 regions by the high-k dielectric polymer 160. The sidewall spacers 280 are formed to isolate the source 250 and drain 260 regions from the conductive polymer semiconductive polymer stack 210. The channel length of the device 50 marked "L" is defined by the thickness of the body layer. Therefore, the thinner the body layer the better the device performance. While the width of the device marked by "W" is defined by the gate pattern. The wider the "W" of the gate, the better the device drivability, and on-current characteristics of the device 50.

Figure 8:
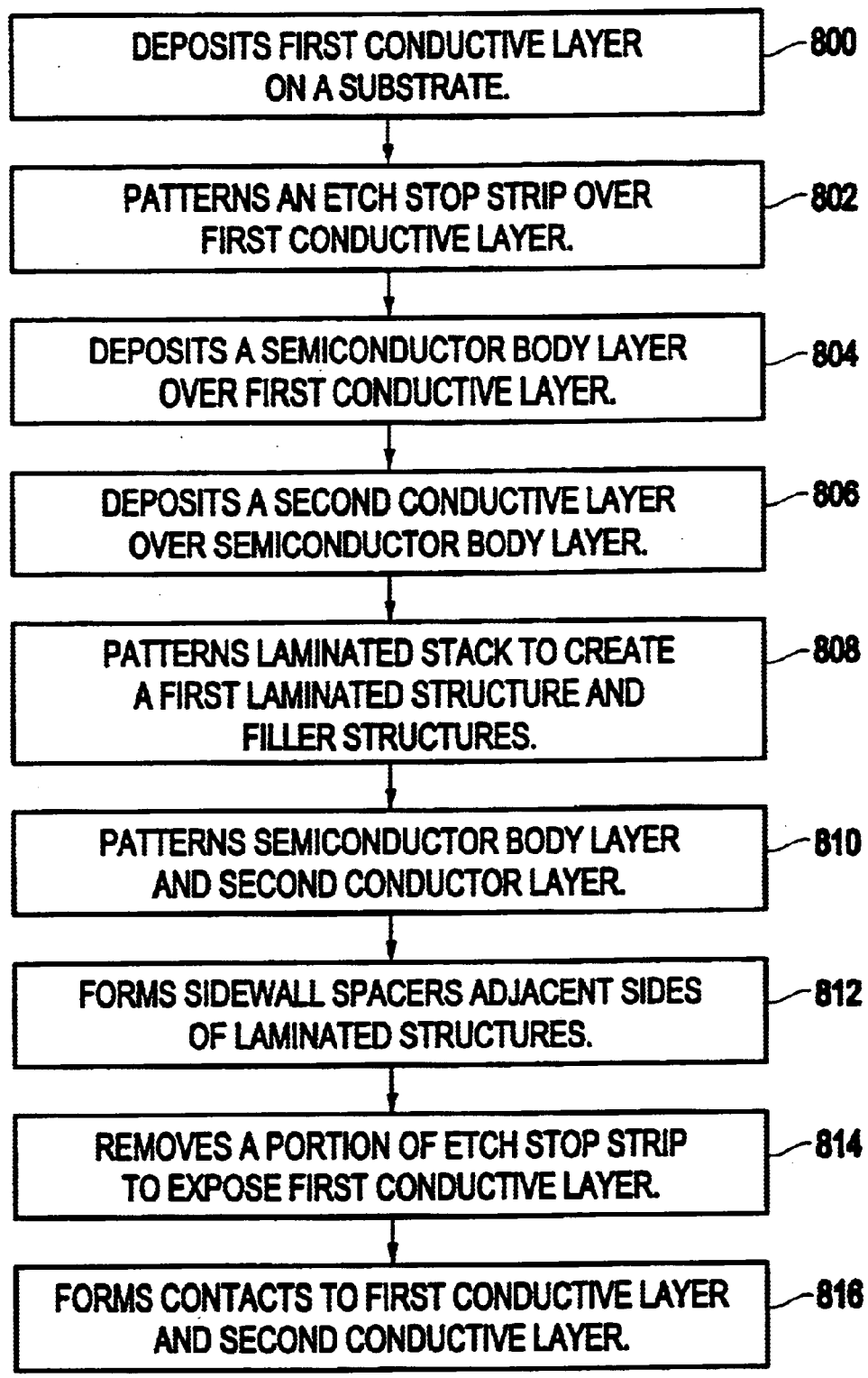
FIG. 8 is a flow diagram illustrating a preferred method of the invention.
Figure 9A:
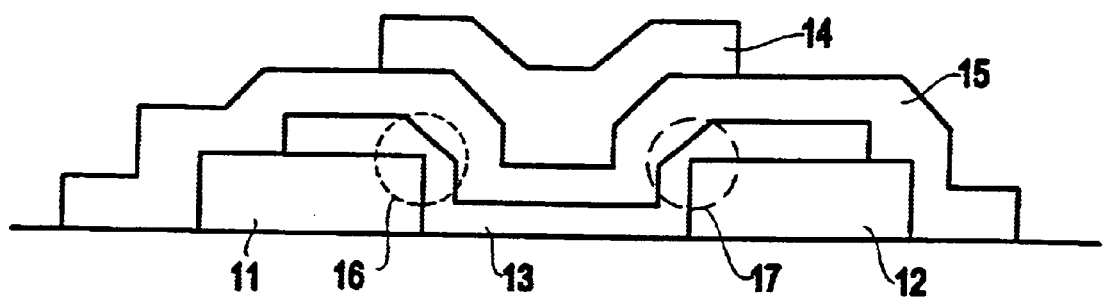
FIG. 9(a) is a schematic diagram of a conventional transistor device.
Figure 9B:
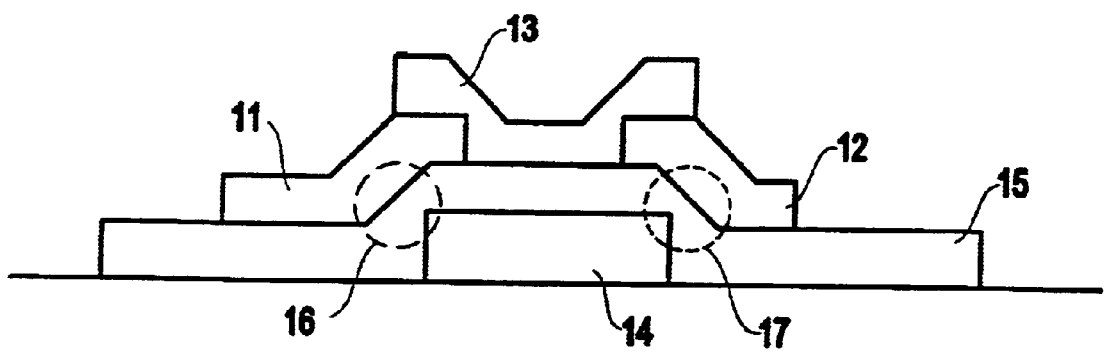
FIG. 9(b) is a schematic diagram of a conventional transistor device.

FIG. 8 illustrates a flow diagram of the process of forming a polymer thin-film transistor with contact etch stops. First, in the process is the depositing of a first conductive layer on a substrate 800. Second, the invention patterns an etch stop strip over the first conductive layer 802. Depositing a semiconductor body layer over the first conductive layer 804 follows and depositing a second conductive layer over the semiconductor body layer 806 is performed thereafter. Next in the process is patterning the laminated stack to create a first laminated structure and filler structures 808. The process continues and petterns the semiconductor body layer and the second conductor layer 810. The invention forms sidewall spacers adjacent sides of the laminated structure 812 and then removes at least a portion of the etch stop strip to expose the first conductive layer 814. The invention then forms contacts to the first conductive layer and the second conductive layer 816.

The unique features of the vertical polymer thin-film transistor 50 are several. For example, the device 50 uses an etch-stop layer 105 to control contact accuracy. Otherwise, over or under etch will cause a short or poor contact to the device 50, respectively. Second, the use of a dummy filler structures 240 ensures planarization of the gate and contact material in order to prevent the material thinning problems (inherent in the prior art devices) due to thermal reflow over the sharp comer areas. Also, a high-k dielectric polymer 160 is used to form the gate dielectric to boost the device performance. Another advantage is that the channel length "L" of the device 50 can be much shorter than those of the conventional planar devices. The channel length "L" is defined by the thickness of the semiconductive polymer layer 120. The channel is limited only by the thinnest film which can tolerate film integrity challenges such as pin holes. Moreover, polymer spacers 280 are used to prevent shorting between conductive polymer layers.

While the invention has been described in terms of preferred embodiments, those skilled in the art will recognize that the invention can be practiced with modification within the spirit and scope of the appended claims.

What is claimed is:

1. A vertical polymer transistor structure comprising:

a first conductive layer;

a semiconductor body layer above said first conductive layer;

a second conductive layer above said semiconductor body layer; and a n etch stop strip positioned between a portion of said first conductive layer and said semiconductor body layer.

2. The vertical polymer transistor structure in claim 1, wherein said etch stop strip is positioned at an outer edge of said semiconductor body layer.

3. The vertical polymer transistor structure in claim 1, further comprising an insulating sidewall spacer connected to sides of said second conductive layer and said semiconductor body layer, wherein said etch stop strip is also between said sidewall spacer and said first conductive layer.

4. The vertical polymer transistors structure in claim 1, further comprising sidewall spacers adjacent sides of said second conductive layer and said semiconductor body layer, wherein said etch stop strip is also between only one sidewall spacer and said first conductive layer.

5. The vertical polymer transistors structure in claim 1, wherein said etch stop strip is position on only one side of said vertical polymer of transistor structure.

6. The vertical polymer transistors structure in claim 1, wherein said first conductive layer, said semiconductor body layer, and said second conductive layer comprise a laminated stack of layers.

7. The vertical polymer transistor structure in claim 6, further comprising a source contact electrically connected to said first conductive layer and a drain contact electrically connected to said second conductive layer, wherein said source contact is on an opposite side of said laminated stack from said drain contact.

8. A vertical polymer transistor structure comprising:

a first conductive layer;

filler structures co-planar with said first conductive layer;

a semiconductor body layer above said first conductive layer;

a second conductive layer above said semiconductor body layer; and an etch stop strip positioned between a portion of said first conductive layer and said semiconductor body layer.

9. The vertical polymer transistor structure in claim 8, where in said filler structures are electrically isolated from said first conductive layer.

10. The vertical polymer transistor structure in claim 8, wherein said filler structures comprise the same material as said first conductive layer.

11. The vertical polymer transistors structure in claim 8, wherein said first conductive layer, said semiconductor body layer, and said second conductive layer comprise a laminated stack of layers.

12. The vertical polymer transistor structure in claim 11, further comprising a source contact electrically connected to said first conductive layer and a drain contact electrically connected to said second conductive layer, wherein said source contact is on an opposite side of said laminated stack from said drain contact.

13. The vertical polymer transistor structure in claim 12, wherein said filler structures support said source con tact and said drain contact.

14. The vertical polymer transistors structure in claim 12, wherein said filler structures are position below said source contact and below said drain contact.

15. The vertical polymer transistor structure in claim 8, wherein said etch stop strip is positioned at an outer edge of said semiconductor body layer.

16. The vertical polymer transistor structure in claim 8, further comprising an insulating sidewall spacer connected to sides of said second conductive layer and said semiconductor body layer, wherein said etch stop strip is also between said sidewall spacer and said first conductive layer.

17. The vertical polymer transistors structure in claim 8, further comprising sidewall spacers adjacent sides of said second conductive layer and said semiconductor body layer, wherein said etch stop strip is also between only one sidewall spacer and said first conductive layer.

18. The vertical polymer transistors structure in claim 8, wherein said etch stop strip is position on only one side of said vertical polymer of transistor structure.

* * * * *